US006256768B1

(12) United States Patent
Igusa

(10) Patent No.: US 6,256,768 B1
(45) Date of Patent: Jul. 3, 2001

(54) AMOEBA DISPLAY FOR HIERARCHICAL LAYOUT

(75) Inventor: Mitsuru Igusa, Los Gatos, CA (US)

(73) Assignee: Silicon Perspective Corporation, Santa Clara, CA (US)

(*) Notice: Subject to any disclaimer, the term of this patent is extended or adjusted under 35 U.S.C. 154(b) by 0 days.

(21) Appl. No.: 09/186,218

(22) Filed: Nov. 3, 1998

(51) Int. Cl.⁷ ............................................. G06F 17/50
(52) U.S. Cl. ........................................... 716/11; 716/1
(58) Field of Search ............................... 716/11, 1

(56) References Cited

U.S. PATENT DOCUMENTS

| | | |
|---|---|---|
| 4,554,625 | 11/1985 | Otten . |
| 4,918,614 | 4/1990 | Modarres et al. . |
| 5,034,899 * | 7/1991 | Schult ................................ 364/518 |
| 5,043,920 * | 8/1991 | Malm et al. ........................ 364/521 |
| 5,675,499 * | 10/1997 | Lee et al. ........................... 364/488 |
| 5,812,415 * | 9/1998 | Baisuck ................................. 716/11 |
| 6,026,226 * | 2/2000 | Heile et al. ........................... 716/12 |
| 6,077,307 * | 6/2000 | Benzel et al. .......................... 716/2 |

\* cited by examiner

Primary Examiner—Matthew Smith
Assistant Examiner—Leigh Marie Garbowski
(74) Attorney, Agent, or Firm—Smith-Hill and Bedell

(57) ABSTRACT

CAD software for automated circuit design provides improved display of hierarchical layout. Component placement perimeters are shown with "amoeba" characteristic for improved circuit floor-planning and analysis. Amoeba view of hierarchical design perimeter enables more intuitive observation of circuit floor-plan from actual component placement. Informational brevity conveyed by perimeters of hierarchies in design facilitates simpler interpretation of complex circuit layout, as well as distributed data access to remote sites through email or low-speed network.

10 Claims, 2 Drawing Sheets

AMOEBA DISPLAY FOR HIERARCHICAL LAYOUT

BACKGROUND OF INVENTION

1. Field of Invention

Invention relates to integrated circuit design, particularly to hierarchical layout display system and methodology for amoeba-type component perimeter placement.

2. Description of Background Art

Electronic circuit and system designs are becoming increasingly complex, sometimes having over ten million transistors. To handle such complex magnitude, circuit designs may be represented hierarchically. Furthermore, computer-aided design (CAD) tools facilitate definition and verification of logic-level, as well as physical-level design representations. Additionally, floor-planning and placement steps serve to convert design representation from logical to physical.

Floor-planning usually provides "high-level" block (i.e., rectangular) diagram representing hierarchical logic design, wherein such blocks may represent top or child-level components in design hierarchy. Moreover, automated placement tools may use floor-planning to provide "strict" or "loose" suggestion of preferred preliminary placement of sub-logic components within blocks. With strict floor-planning approach, components in each floor-plan block are generally placed in confines bordering correspondingly drawn block, whereas in loose floor-planning approach, automated placement algorithm generally has more freedom for components to lie beyond boundaries drawn in given hierarchy.

Oftentimes, however, design trade-offs arise, for instance, whereupon strictly enforced floor-planning results in undesirable longer wire connection lengths, which translate to physically larger and/or un-route-able layouts as compared to more loosely governed floor-plans. Hence, more strictly enforced floor-planning approach generally require unduly tedious effort to achieve desired physical design. But, such strictly enforced floor-planning may nonetheless offer designers better control, for example, over design timing, as well as more independent implementation of hierarchical sub-components. Furthermore, in comparison to such strict approach, relatively loose floor-planning, as well as so-called "flat" (i.e., non-hierarchical) automatic placement approaches tend to place components in generally non-hierarchy manner and shape, whereby resulting constraints may generate more route-able placements.

In view of various design tradeoffs, therefore, there is increased need to provide improved automated methodology and system to assist electronic design engineers to accomplish higher quality hierarchical circuit and system designs without unreasonable burden, particularly in terms of time, effort, and difficulty of use.

SUMMARY OF THE INVENTION

Invention resides in computer-implemented electronic design automation (EDA) software and associated processing firmware or hardware for circuit and/or system definition or verification, wherein designer visual feedback about hierarchical physical design is displayed in uniquely simplified and more intuitive manner. In particular, design floor-plan having "amoeba"-like generally less-structured cellular perimeter characteristics associated with hierarchical component groupings, sub-groupings, or super-groupings are generated by automated placement scheme. Preferred placement process produces faster, more compact, and more easily analyzable physical design solution by determining perimeters of hierarchical circuit components or specified groupings thereof, according to unique amoeba-style algorithm associated with displaying actual observable perimeters for hierarchical circuit components.

In particular, present process achieves improved tool performance, in significant part, by computing perimeter values at each hierarchy level, then displaying amoeba-like closed rectilinear polygons formed by such perimeters. Physical design display of largely component perimeters is faster to draw than including lower-level component circuit details, as well as being visually less cluttered, and therefore intuitively easier for designers to understand at relatively higher level of circuit functionality.

Optionally, simplified display data including actual object perimeter information may be transmitted more efficiently over electronic network to share hierarchical design prototype as email or fax, for example, sent to other remote designer workstations for further analysis and verification thereof.

DETAILED DESCRIPTION OF PREFERRED EMBODIMENT

Figure 1A:
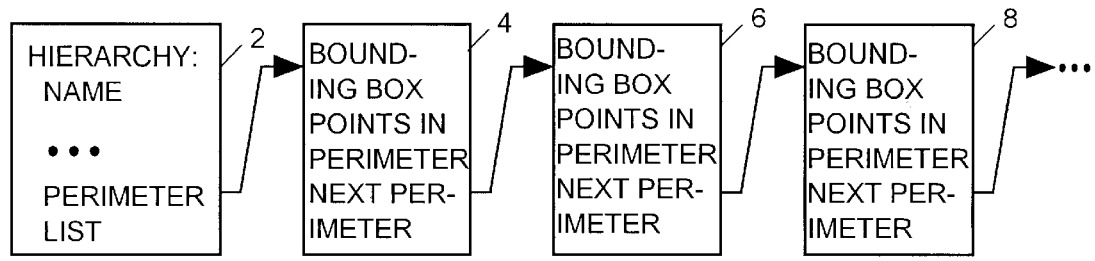
FIGS. 1A–B and 2A–B show respectively methodology flow and sample layout display according to present invention.

Generally, preferred embodiment is implemented as computer program or application, including associated data files and related program code, and/or any associated hardware or firmware for execution on conventional computer or other single or multiple processing facility coupled possibly to network for distributed processing. In particular, present inventive methodology may reside in electronic design automation (EDA) software tool or suite thereof for prototype circuit and system definition and verification, thereby providing computer-assisted analysis and engineering of subject design.

In accordance with various aspects of present invention, computer-automated method, process, system and/or apparatus enables hierarchical design processing, initially by receiving design representation (e.g., circuit netlist file, high-level functional or behavioral description, or other equivalent specification) which includes various interconnected components, such design representation also preferably having one or more various hierarchy levels associated with various components and/or super- or sub-components.

As used herein, term "hierarchy" or "hierarchical" is understood and interpreted expansively to mean or refer to any user or automated tool-specified or selected aggregation, collection, identification, grouping or association into one or more actual, related, functional, or arbitrary level, set, or other sub- or super- classification of one or more objects or instances, such as components, circuits, interconnect, or signals, included in one or more system and/or circuit design.

Additionally, more particularly, such design representation is processed electronically by processor, computer, or other engineering workstation facility programmed as specified generally herein preferably, to sort or otherwise logically or arbitrarily organize circuits, components or object instances according to corresponding instance height (e.g., by sorting instance list of uniform height rectangles). Then, for each hierarchy level specified in subject design, actual placement perimeter or other associated border measurement values may be generated according to scan-line procedure or algorithm described herein to determine list of perimeters around or otherwise outlining outer edges of sub-components in specified hierarchies.

As used herein, term "perimeter" is understood and interpreted expansively to mean or refer to any measurable length or distance otherwise surrounding completely or partially around, about or external to one or more components, circuits, interconnect, signals, or objects or instances representative thereof, as grouped or otherwise associated in one or more specified or selected level or collection.

Furthermore, displayable representation or otherwise one or more electronically drawable signal or file of various amoeba-style drawings is automatically generated by present programmed system to correspond to such subject design representation, wherein such drawings show various component, circuit, or other related object or instance perimeters associated with one or more selected hierarchy in subject design.

As used herein, term "amoeba" is understood and interpreted expansively to mean or refer to any one or more physical or drawn component, circuit, interconnection, object, instance, or symbolic or schematic representation thereof having an associated perimeter to define a shape thereof.

Preferably, perimeters as defined and generated herein for subject design may be selectably size-filtered or otherwise automatically processed and analyzed from being displayed, i.e., by effectively screening, obscuring, or omitting from being viewed largest or relatively larger set of one or more perimeters for each selected hierarchy level to reduce screen output clutter. Also, certain hierarchies may be marked or otherwise designated by tool user or circuit designer, thereby, for example, identifying only selected hierarchy level(s) for current or subsequent drawing or display.

More particularly, when such displayable representation of subject design is displayed, user may select such hierarchies or levels thereof by manually or electronically indicating or otherwise identifying shown perimeters associated therewith. Hence, in effect recursively for selected hierarchy, one or more perimeter may be generated according to scan-line procedure specified herein for each associated hierarchical component.

Moreover, upon such hierarchical selection, one or more selected hierarchy properties may be modified; or certain statistical data, such as average wire-loading, may be determined accordingly. Additionally, display data or other electronically observable attributes associated with physical or other symbolic representation of subject design may be accessed remotely through relatively slow communications link, such as conventional e-mail or fax transmission.

Furthermore, in accordance with one aspect of the present invention, visual treatment or display representation of one or more hierarchical components or objects or instances corresponding thereof, which are provided in so-called "flat" physical implementation of electronic circuits, are combined with various automated placement algorithms that provide so-called "loose" hierarchical constraints, thereby effectively combining or optimizing "strict" and "loose" floor-planning approaches to physical layout methodologies, as specified herein.

Preferred scan-line procedure or algorithm calculates using present computer system one or more perimeters of hierarchies or levels thereof in subject design, as well as various associated high-level design information derived therefrom for user design feedback, analysis, and remote diagnostics.

Such scan-line procedure serves to enable relatively faster computation of perimeters of design hierarchies. Preferred algorithm general phases follow:

1. Pre-processing Phase: Sorts and breaks down all instances in subject design to uniform height.
2. Scan-line Procedure Phase: For each hierarchy to be displayed, scan-line algorithm applied on hierarchy to obtain certain perimeters (i.e., by generating list of minimum enclosed disjoint perimeters, such as those which cover standard cells and blocks exclusively in design hierarchy).
3. Cleanup Phase: Sorts perimeters for hierarchy in decreasing size for display or evaluation.

Preferably, pre-processing phase is performed after each so-called "new-placement," before hierarchy-perimeter values are computed. Such pre-processing phase assumes that flat-level placement follows certain rules, such as for so-called "standard-cell" style placement, as follow:

1. Height of instance in design are multiple of "standard-cell" height.
2. Bottom boundary of instances coincide with non-overlapping rows, whereby height of each row is standard-cell height.
3. Instances do not overlap.

Additionally, preferred pre-processing phase includes following steps:

1. Create array of non-overlapping rows (e.g., sorted from bottom to top), in accordance with foregoing non-overlapping rules.
2. Fracture instances into minimum or standard-cell height rectangles, and label such rectangles with so-called "belonging-to" instances.
3. Create list of so-called "fractured rectangles of multiple height instances" and "minimum height instances."
4. Sort from list of fractured instance and rectangles from left-to-right and top-to-bottom.
5. Add to row array such that each row array element references "left-most" fractured instance or rectangle in each row.

As implemented, scan-line procedure serves to generate list of uniform height rectangles, preferably arranged in rows which are sorted from bottom to top, thereby providing improved and accurate computational performance.

Hence, for given hierarchy or level thereof in which to determine certain perimeters, such scan-line approach is accomplished as follows:

1. If one or more perimeters for subject design selected hierarchy is so-called "cached" status, then system returns "cached" list of perimeters for such selected hierarchy.
2. Obtain bounding box or equivalent physical delimiter or regions associated with hierarchy of determined perimeter.
3. Obtain range of rows $r_k$, $r_{k+1}$, . . . $r_m$ in row array, particularly corresponding to bounding box of present hierarchy.
4. Initialize perimeter list (i.e., set to NULL value).
5. For each row r in $r_k$, . . . $r_m$ do:
6. Create new bounding boxes or equivalent physical delimiter or regions around continuous set of instances in hierarchy in row r.
7. Merge new bounding boxes on top of current perimeter list:

8. For each new bounding box b, do:
   9. If bounding box b is not touching existing perimeter, then:
      10. Case-1: Add bounding box to perimeter list.
   11. Else, if bounding box b touches only one perimeter, then:
      12. If bounding box b touches perimeter on one edge, then:
         13. Case-2a: Add bounding box b to top of that perimeter.
      14. Else, bounding box b touches existing perimeter n times such that n>1:
         15. Case-2b: Add bounding box b to top of perimeter and create n-1 so-called "doughnut-hole" or internal opening perimeters.
      16. Else, bounding box b touches more than one existing disjoint perimeter.
         17. Case-3: Merge all perimeters to bounding box (i.e., add doughnut holes, if touching bounding box in multiple places).
   end
  end merge
end.

When operating, present system continually determines list of perimeters by effectively growing or adding to such perimeter list to include instances in given hierarchy from bottom row, then adding instances from next-to-bottom row, and so forth, until all instances in such hierarchy are included therein.

Figure 1B:
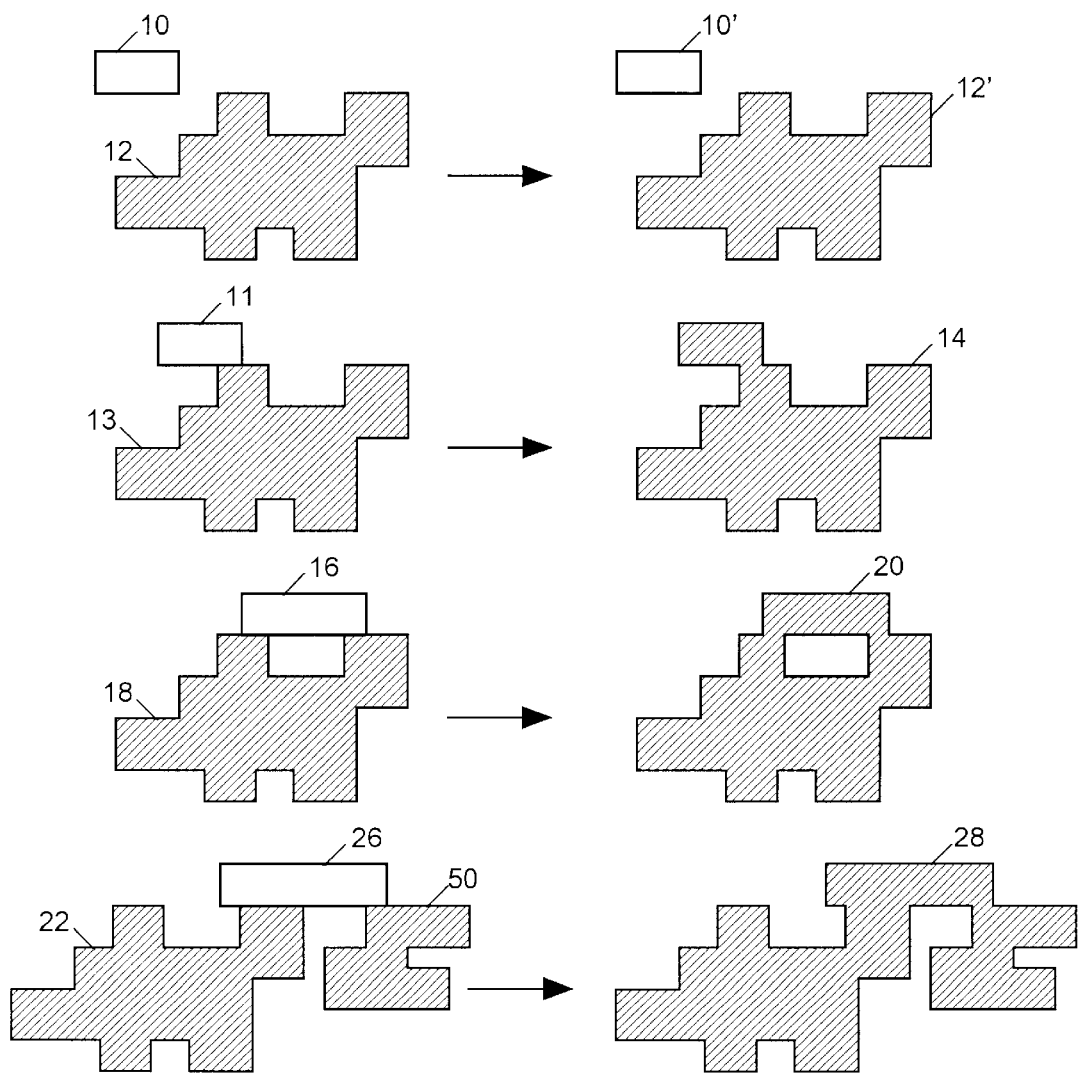

FIG. 1B shows merger of new boxes on top of current perimeter list, for example, illustrating three cases of relationship between new box to be added to perimeter list relative to previously computed perimeter list, both before and after modification of current perimeter list.

Case-1: New box 10 does not touch existing perimeter 12. So, new disjoint perimeter 10' is started relative to perimeter 12'.

Case-2a: New box 11 touches only one existing perimeter 13 in one place. So, new box is merged 14 to existing perimeter.

Case-2b: New box 16 touches only one existing perimeter in more than one place. So, new box is merged 20 to existing perimeter, thereby creating doughnut hole.

Case-3: New box 24 touches multiple existing perimeters 22, 26. So, merge perimeters 22, 26 are merged 28 with box 24.

Furthermore, in cleanup phase, after perimeters for hierarchy of design are computed, each perimeter bounding box and sort perimeters are computed in decreasing area, and then reference from hierarchy is saved to sorted perimeter list, as follows:

1. For each perimeter:
2. Save perimeter bounding box.
3. Sort perimeters in decreasing area
4. Set hierarchy cached perimeter list pointer.

Generally, resulting computation of perimeters for hierarchical subcircuit are similar to data structure, as shown in FIG. 1A. Perimeter list data structure for hierarchical sub-circuits is illustrated, whereby perimeter list 2 relates hierarchically to next-level bounding box 4, which relates hierarchically to another level bounding box 6, which relates hierarchically to another level bounding box 8, and so forth.

Furthermore, when any flat or equivalent level instance, such as block or standard cell, is moved or otherwise replaced, hierarchical perimeters are computed anew with addition of cleanup step prior to pre-process phase, for example, whereby boxes of fractured instances from previous pre-process phase and previously cached perimeters are accordingly cleaned-up.

After design hierarchy-related perimeters are computed, such computed values are then used for associated tool applications, such as physical system or circuit lay-out or floor-planning display, as well as user selection and hierarchy operation, and transmission of light-weight or compactly portable netlist and related perimeters over distributed computer network.

Preferably, top or other level hierarchy display or other electronic observable presentation thereof is accomplished using user-selected, highlighted or otherwise identified perimeters, e.g., as computed by perimeter algorithm described herein to display visibly simplified physical layout of automatically-placed design. Further to reduce clutter or other visibly distracting features or arrangement in such display of perimeters for each hierarchy, certain such perimeters may be designated as being relatively insignificant, for example, by being deemed to be too small relative to specified threshold or criteria, or having such hierarchy placement characteristic that is physically too spread-out according to specified threshold or criteria to accept hierarchies having certain amount or level of disjoint or spread-out perimeters. Accordingly, such certain perimeters may be marked for each hierarchy, for example, by filtering effectively those largest disjoint perimeter and all other disjoint perimeters in such hierarchy that are at least specified proportion (e.g., 30%) of area of subject hierarchy.

Figure 2A:
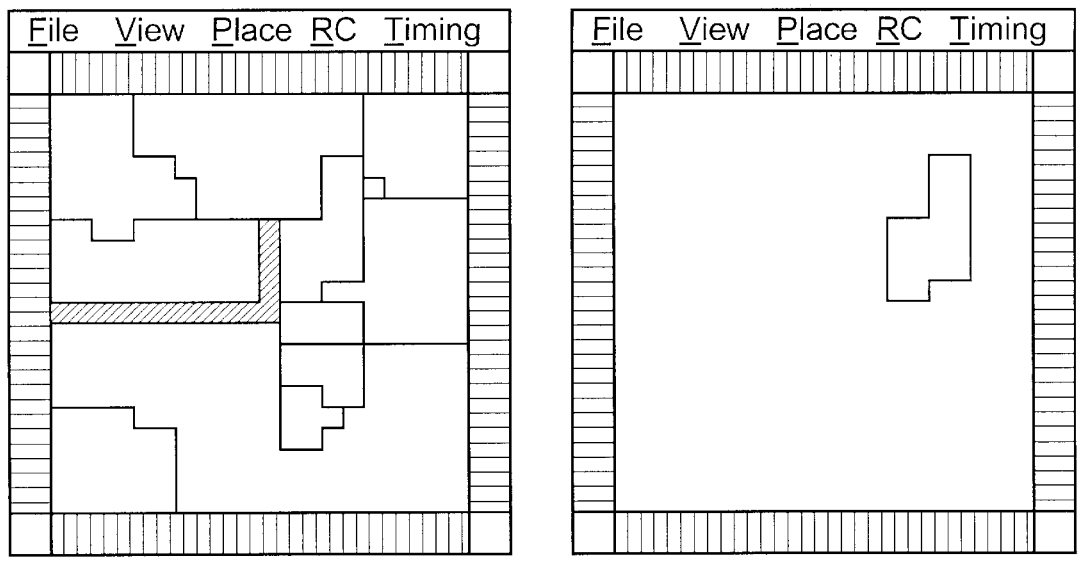

In addition, preferably, levels of design hierarchy are marked for drawing thereof. Initially, top level of hierarchy is drawn, as shown representatively in FIG. 2A. Here, lower levels of design hierarchy are selected effectively by marking appropriate hierarchies with so-called "to-be-drawn" flag. To draw desired perimeters of entire hierarchy, following procedure may be applied initially with root or such equivalent level of hierarchical design:

Procedure: draw hierarchy root:
  For each child-hierarchy h of given hierarchy root:
    If hierarchy h is "to be-drawn", then
      Get perimeter of hierarchy
      Draw perimeter+label of hierarchy
    Else
      Recursively draw hierarchy h
  end Thus, relatively quickly, users or designers may detect potential design or placement problem with one or more desired or expected critical timing paths for prototype circuits or system lay-out by observing spatial placement or relative positional relationships of design hierarchies or such amoeba-style perimeter shapes representative thereof. Designer may visibly verify relative distance between certain hierarchies, for example, whereupon hierarchy-A should be neighbor of hierarchy-B due to critical signals known to pass therebetween.

Figure 2B:
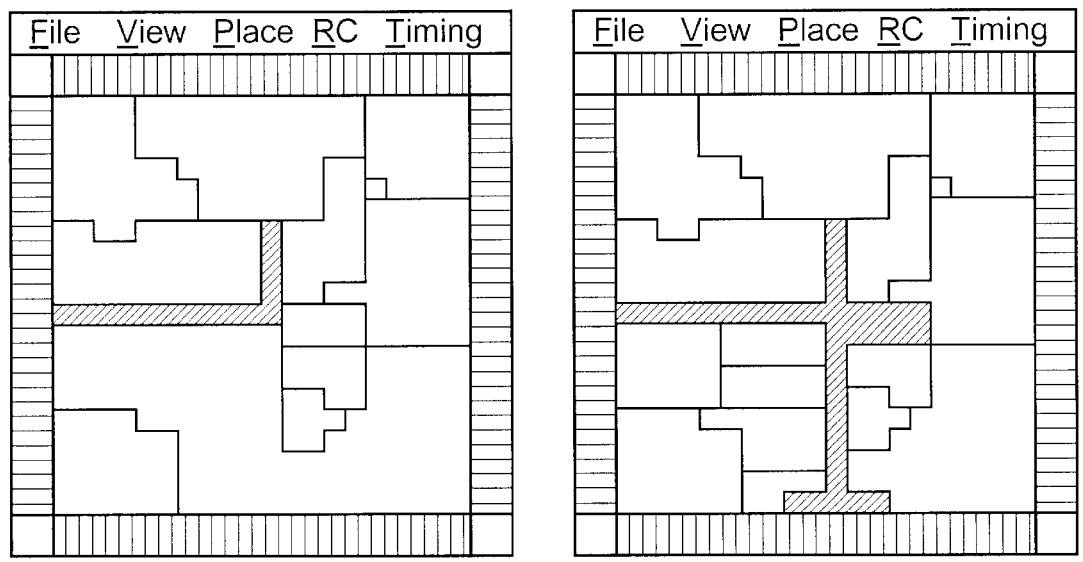

Additionally, connectivity of hierarchy with neighboring critical sub-circuits intended to be kept close together might be visibly detected to be spread apart or fragmented undesirably, as shown in FIG. 2B in case of hierarchical amoeba views of top-level and push down to one level for hierarchy "block A."

Regarding selection of amoeba or associated hierarchical perimeter, designer, floor-planner, user, or place-and-route engineer effectively selects or otherwise identifies hierarchy in context of real placement by mouse-clicking or other functionally equivalent user input mechanism upon designated subject amoeba drawing as described herein. In simple operation, selectively lower level of hierarchy may be selected accordingly to check effective locality of sub-components associated therewith.

Furthermore, other tool operations or related applications can be invoked similarly through such select-by-hierarchy-perimeter and/or other specified user input or action upon such subject hierarchy, as follow:

1. Adding hierarchical properties, such as placement density
2. In-place partitioning of hierarchy
3. Drawing external net "flight" lines to selected hierarchy
4. Generating and displaying wire-load model of select hierarchy, etc.

In accordance with an optional aspect of present invention, present hierarchical perimeters described herein may be used for sending effectively light-weight or compact version of design information or file representative thereof to various remote or distributed location or other computing sites accessible over one or more interconnected digital networks coupled to present design computing platform for distributed or networked design, analysis, or diagnosis. In this networked manner, design data transmission to remote nodes face various challenges, as follow:

1. Large design data files to be sent over relatively low-speed network
2. Privacy of proprietary and confidential design information to be distribute externally over potentially unsecured communications channels Accordingly, preferred approach is to send present partial or compacted design information using digital encryption thereof. For example, design object names may be encrypted or scrambled, such that designer has encryption-key to translate from encrypted names to actual names. Top level or top-two levels of hierarchy may be sent with placement perimeters, such transmitted information effectively and selectively describing important physical attributes of subject design floor-plan, for example, without unnecessarily revealing logic functions or purpose of actual design.

Hence, remote site user may use transmitted perimeter information to convey or otherwise determine actual floor-plan, and examine so-called "goodness" or other quantitative or qualitative attributes of prototype circuit or system floor-plan, and thereby suggest better implementation of placement, for example, without being exposed to more sensitive design data.

Preferably, high-level abstraction of floor-plan is transmitted by image (e.g., fax), or electronically encapsulated data (e.g., email, ftp), as follow representatively:

Procedure to send encapsulated "amoeba" data:
A. Send mode:
1. Scramble instance/cell/hierarchy names
2. Create partial design description file consisting of:
    a) Top-level hierarchy with or without connection list
    b) Perimeters
3. Compress and uuencode for email transmission
B. Receive mode:
1. De-encode/decompress email
2. Import partial design in GUI system
3. Display hierarchy as described in display portion of invention
C. Modify floor-plan
1. Send back modified data back to sender
D. Sender receive mode:
1. Retrieve modified data
2. De-encrypt names
3. Update CAD system with new data Foregoing described embodiments of the invention are provided as illustrations and descriptions. They are not intended to limit the invention to precise form described. In particular, Applicant contemplates that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A method for processing a logic design defining an integrated circuit (IC) as a multiple level hierarchy of components formed by a plurality of cells, the method comprising the steps of:
    a. processing said logic design to generate one of either a flat or a loose IC layout wherein cells of components of the IC are assigned to separate positions within an IC substrate;
    b. analyzing said IC layout and the logic design to identify positions within said substrate to which cells forming each component of said hierarchy were assigned at step a; and
    c. determining from the positions identified at step b, a shape and position of each of a plurality of areas of said layout, wherein each component of said multiple-level hierarchy corresponds to at least one area of said plurality of areas, and wherein each area of said plurality of areas has a perimeter sized and shaped to encompass those cells which are both included in the area's corresponding component and which are contiguous to one another within said layout.

2. The method of claim 1 further comprising the step of:
    d. displaying an amoeba-style drawing representing the layout, the drawing showing the perimeters of a subset of the plurality of areas determined at step c.

3. The method of claim 2 further comprising the step of:
    e. selecting said subset of the plurality of areas whose perimeters are displayed at step d based on a number of cells included in each area.

4. The method of claim 2 further comprising the step of:
    e. selecting said subset of the plurality of areas whose perimeters are displayed at step d based on the level of said hierarchy upon which each area's corresponding component resides.

5. A method for processing a design describing a hierarchy of components, wherein each component is assigned to a level of a multiple level hierarchy, and wherein each component is formed by a plurality of cells, the method comprising the steps of:
    a. generating a graphic design depicting a layout of all cells forming components of said hierarchy;
    b. receiving the graphic design; and
    c. determining from the graphic design a perimeter of areas of said layout bounding clusters of cells forming each component associated with such hierarchy; and
    d. generating a representation of at least one amoeba-style drawing corresponding to the graphic design, wherein such drawing shows one or more perimeters associated with one or more components of said hierarchy.

6. The method of claim 5 further comprising the step of:
    e. selecting each perimeter to be displayed in said drawing according to a number of cells bounded by the perimeter.

7. The method of claim 5 further comprising the step of e. selecting each perimeter to be displayed in said drawing according to an assigned level of said multiple level hierarchy of a component formed by cells bounded by the perimeter.

8. A method for designing an integrated circuit (IC) comprising the steps of:

a. generating a hierarchical logic design defining said IC as a hierarchy of interconnected components and cells, wherein said hierarchy comprises multiple levels including a lowest level and at least one higher level, wherein each of said component is assigned to one of said multiple levels, wherein said hierarchical logic design defines each component assigned to said lowest level as being formed by a plurality of said cells, and wherein each component assigned to each of said higher levels is formed by at least one component assigned to lower levels of said hierarchy;

b. processing said hierarchical logic design to generate an IC layout wherein each cell of the IC is assigned to a unique position within an IC substrate, wherein said unique position for each cell forming each component is determined based on criteria other than one of placing all cells forming a same component within a particular portion of said substrate;

c. analyzing said IC layout and the hierarchical logic design to identify positions within said substrate to which cells forming each component of said hierarchy were assigned at step b; and d. determining from the positions identified at step c, a shape and position of each of a plurality of areas of said layout, wherein each component of said multiple-level hierarchy corresponds to at least one area of said plurality of areas, and wherein each area of said plurality of areas has a perimeter sized and shaped to encompass cells which the hierarchical design defines as forming the area's corresponding component.

9. The method of claim 8 further comprising the step of:

e. generating a first display depicting perimeters of each of said plurality of areas of said substrate determined at step d for which said hierarchical design assigned the areas' corresponding components to a particular single level of said hierarchy, perimeters of all others of said plurality of areas determined at step c being excluded from said first display.

10. The method of claim 9 wherein one of the perimeters depicted in said display corresponds to a particular one of said components which said hierarchical design defines as residing on said particular level of said hierarchy and as being formed by a plurality of components residing at a next lower level of said hierarchy, the method further comprising the steps of:

f. selecting said one of said perimeters depicted in said first display, and g. modifying said display so that it depicts perimeters of each of said plurality of areas of said substrate corresponding to components forming said particular one of said components.

* * * * *